United States Patent
Park (10) Patent No.: US 7,723,765 B2
(45) Date of Patent: May 25, 2010

(54) IMAGE SENSOR HAVING HYDROPHILIC AND HYDROPHOBIC MICROLENSES AND METHOD FOR MANUFACTURING THE SAME

(75) Inventor: Jin Ho Park, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 220 days.

(21) Appl. No.: 11/986,994

(22) Filed: Nov. 26, 2007

(65) Prior Publication Data
US 2008/0135899 A1      Jun. 12, 2008

(30) Foreign Application Priority Data
Dec. 7, 2006    (KR)    ............... 10-2006-0123512

(51) Int. Cl.
*H01L 31/00* (2006.01)
(52) U.S. Cl. ............... 257/292; 257/E33.076; 438/70
(58) Field of Classification Search ............... 257/292, 257/457, 458, E33.076, E33.077; 438/70
See application file for complete search history.

(56) References Cited

U.S. PATENT DOCUMENTS 6,379,992 B2*   4/2002   Jo ............................ 438/70

| | | | |
|---|---|---|---|
| 2004/0001259 A1* | 1/2004 | Ohtsu et al. | 359/619 |
| 2005/0281942 A1 | 12/2005 | Park et al. | |
| 2006/0138500 A1* | 6/2006 | Kim | 257/294 |
| 2008/0007839 A1* | 1/2008 | Deng et al. | 359/642 |

FOREIGN PATENT DOCUMENTS

| KR | 10-2004-0058749 | 7/2004 |
|---|---|---|
| KR | 10-2005-0120404 | 12/2005 |

OTHER PUBLICATIONS

Nam Soo Kim and Jeong Lyeol Park; Method for Forming Microlens in Image Sensor to Remarkably Improve Performance of Image Sensor; Korean Patent Abstracts; Publication No. 1020050120404 A; Published Dec. 22, 2005; Korean Intellectual Property Office, Korea.
Won Ho Lee; CMOS Image Sensor with Different Radius of Curvature of Microlens Corresponding to Wavelength of Incident Light and Manufacturing Method Thereof; Korean Patent Abstracts; Publication No. 1020040058749 A; Published Jul. 5, 2004; Korean Intellectual Property Office, Korea.

* cited by examiner

*Primary Examiner*—Thomas L Dickey
(74) *Attorney, Agent, or Firm*—The Law Offices of Andrew D. Fortney; Andrew D. Fortney (57) ABSTRACT

An image sensor may comprise photodiodes on a semiconductor; color filters on the photodiodes; a planarization layer covering the color filters; and microlenses on the planarization layer, including alternate hydrophilic microlenses and hydrophobic microlenses contacting the edges of the hydrophilic microlenses, corresponding to respective color filters.

20 Claims, 8 Drawing Sheets

IMAGE SENSOR HAVING HYDROPHILIC AND HYDROPHOBIC MICROLENSES AND METHOD FOR MANUFACTURING THE SAME

The present application claims priority under 35 U.S.C. 119 and 35 U.S.C. 365 to Korean Patent Application No. 10-2006-0123512 (filed on Dec. 7, 2006), which is hereby incorporated by reference in its entirety.

BACKGROUND

Embodiments of the invention relate to an image sensor and a method for manufacturing the same.

An image sensor is defined as a semiconductor device converting an optical image into an electrical signal. Representative image sensors of the related art include a charge coupled device (CCD) and a CMOS image sensor, etc.

The image sensor may be manufactured according to the following process.

First, transistors and a photodiode electrically connected to one or more of the transistors are formed on a semiconductor substrate, and an insulating layer structure and wiring are formed on or over the transistors and the photodiode. Continuously, a color filter layer formed of red, green, and blue filters is formed on the insulating layer structure, and a positive type photoresist layer is applied to the upper surface of the color filter layer to form a planarization layer. Thereafter, a photoresist layer is applied to the upper surface of the planarization layer and patterned, and then a reflow process is performed to form a microlens providing light condensed in the photodiode.

The microlens is formed by forming a photoresist layer on the planarization layer and patterning it. However, when the microlens is formed by patterning the photoresist layer as described above, a gap of about 100 nm to 200 nm is formed between the microlenses so that light is incident through the gap, having a problem that the image quality may be less than optimal or ideal.

SUMMARY OF THE INVENTION

Embodiments of the invention provide an image sensor and a method for manufacturing the same improving image quality by removing a gap between microlenses.

An image sensor according to embodiments of the invention comprises: photodiodes on a semiconductor; color filters (or a color filter layer) on respective photodiodes; a planarization layer covering the color filters; and microlenses on the planarization layer, having alternate hydrophilic microlenses and hydrophobic microlenses contacting edges of the hydrophilic microlenses, corresponding to respective color filters.

A method for manufacturing an image sensor according to embodiments of the invention comprises the steps of: forming photodiodes on a semiconductor substrate; forming a first color filter, a second color filter adjacent to the first color filter, and a third color filter adjacent to the second color filter on the respective photodiodes; forming a planarization layer covering the first, second and third color filters; forming a first type (e.g., hydrophobic or hydrophilic) microlenses on the planarization layer corresponding to the first and third color filters; and forming a second type (e.g., hydrophilic or hydrophobic) microlenses on the planarization layer corresponding to the second color filter, in contact with edges of the first type microlenses.

An image sensor according to another embodiment comprises: photodiodes on a semiconductor substrate; color filters on respective photodiodes, having a first color filter with a first height and a second color filter with a second height different than the first height at an edge of the first color filter; and first microlenses on the first color filter and a second microlenses on the second color filter.

A method for manufacturing an image sensor according to another embodiment comprises the steps of: forming photodiodes on a semiconductor substrate; forming color filters on respective photodiodes, having a first color filter with a first thickness and a second color filter with a second thickness different from the first thickness at an edge of the first color filter; forming a first microlens on the first color filter; and forming a second microlens on the second color filter.

DETAILED DESCRIPTION OF THE EMBODIMENTS

Hereinafter, an image sensor and a method for manufacturing the same according to embodiments of the invention will be described in detail with reference to the accompanying drawings.

First Embodiment

Figure 1:
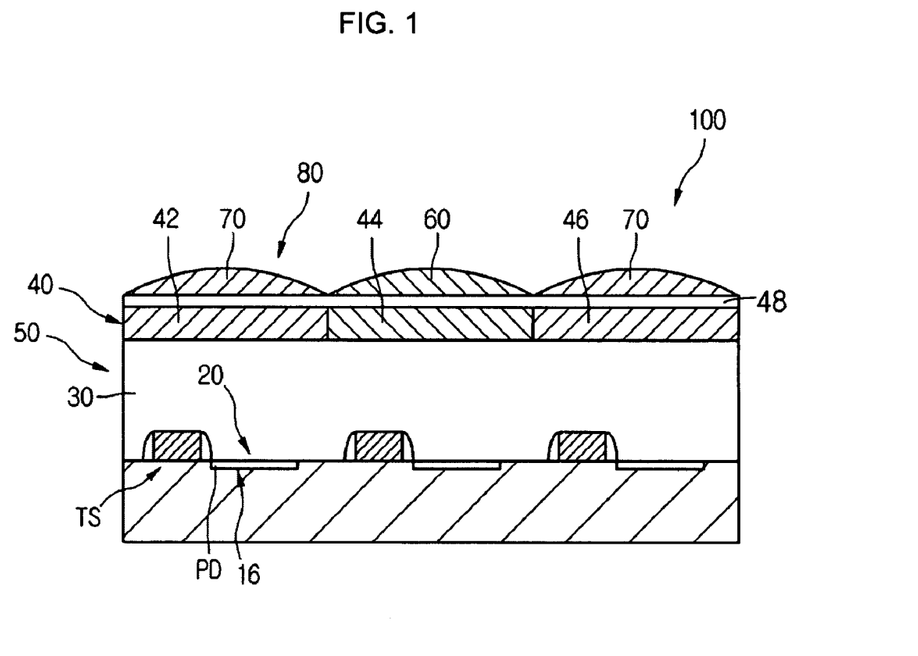
FIG. 1 is a cross-sectional view showing an exemplary image sensor according to a first embodiment.

FIG. 1 is a cross-sectional view showing an image sensor according to a first embodiment of the invention.

Referring to FIG. 1, unit pixels 50 having photodiodes 20 (or PD) are arranged or formed on a semiconductor substrate 10. In one embodiment, the unit pixels 50 may comprise a photodiode 20, an insulating layer 30, a color filter layer 40, and a planarization layer 48. The photodiodes 20 are formed in plural on the semiconductor substrate 10, and FIG. 1 shows three photodiodes 20 by way of example. Insulating layer 30, color filter layer 40, and planarization layer 48 are described in greater detail with regard to FIGS. 4-9 below.

Figure 2:
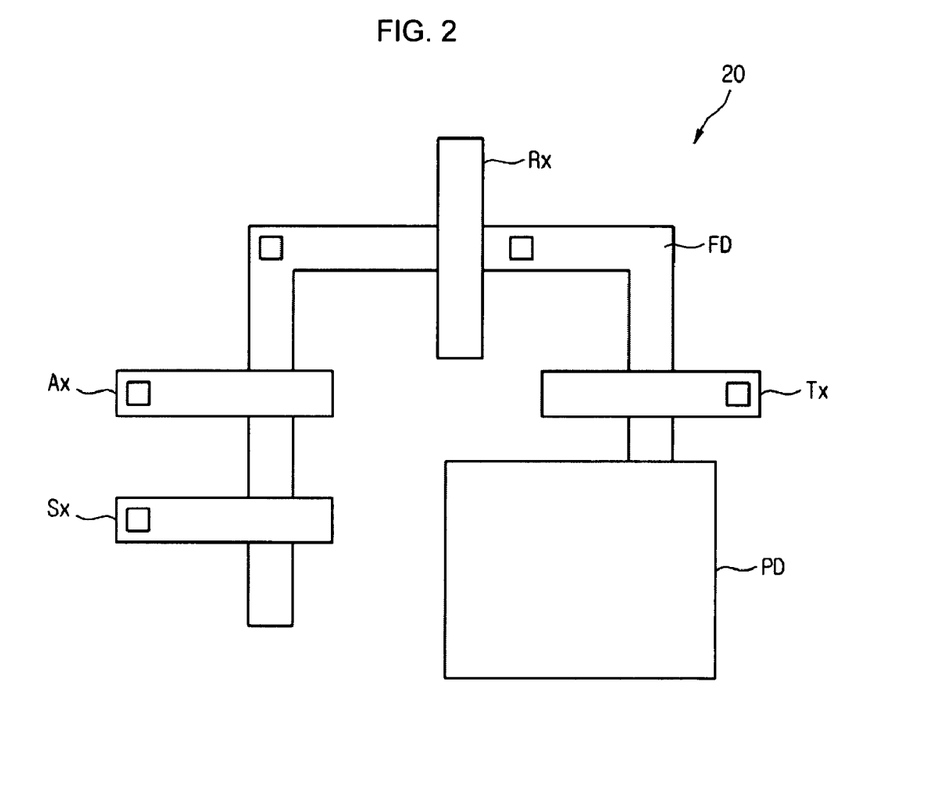
FIG. 2 is a plan view showing a layout of an exemplary unit pixel, including a photodiode structure as shown in FIG. 1.

FIG. 2 is a plan view showing one of pixels including the photodiode structures shown in FIG. 1.

Referring to FIG. 2, the pixel 20 comprises a photodiode PD and transistor structures. The transistor structures comprise a transfer transistor Tx, a reset transistor Rx, a select transistor Sx, and an access transistor Ax.

The transfer transistor Tx and the reset transistor Rx are connected to the photodiode PD in series. The source of the transfer transistor Tx is connected to the photodiode PD, and the drain of the transfer Tx is connected to the source of the reset transistor Rx. A power supply voltage Vdd is applied to the drain of the reset transistor Rx.

The drain of the transfer transistor Tx serves as a floating diffusion (FD) layer. The floating diffusion (FD) layer is connected to the gate of the select transistor Sx, generally via overlying metallization (not shown) and one or more contacts. The select transistor Sx and the access transistor Ax are connected in series. In other words, the source of the select transistor Sx and the drain of the access transistor Ax are connected to each other. The power supply voltage Vdd is applied to the source of the access transistor Ax. The drain of the select transistor Sx corresponds to an output terminal Out, and a select signal is applied to the gate of the select transistor Sx.

The operation of the pixel structures 50 of the image sensor 100 having the structure as described above will be briefly described.

First, the potential of the floating diffusion (FD) layer becomes the same as the power supply voltage Vdd by turning on the reset transistor Rx and then, the reset transistor Rx is turned off. Such an operation is defined as a reset operation.

If external light is incident on the photodiode PD, electron-hole pairs (EHP) are generated in the photodiode PD so that signal charges accumulate within the photodiode PD. Then, as the transfer transistor Tx is turned on, the signal charges accumulated within the photodiode PD are output to the floating diffusion (FD) layer to be stored in the floating diffusion (FD) layer.

Accordingly, the potential of the floating diffusion (FD) layer is changed in proportion to the amount of charge output from the photodiode PD, and the potential of the gate of the access transistor Ax is thereby changed. At this time, if the select transistor Sx is turned on by means of the select signal Row, data are output to an output terminal Out.

After the data are output, the pixel 50 performs the reset operation again. The respective pixels 50 including the photodiode structures PD repeat the processes as described above and convert light into electrical signals, outputting an image.

Referring again to FIG. 1, an insulating layer structure 30 covers the pixels 50 on the semiconductor substrate 10. Generally, the insulating layer structure 30 comprises one or more dielectric layers, such as silicon dioxide (which may be undoped, silicon-rich, or doped with fluorine or with boron and/or phosphorous), silicon nitride, or a low k dielectric such as silicon oxycarbide (SiOC) or hydrogenated silicon oxycarbide (SiOCH). In one embodiment, insulating layer structure 30 comprises a plurality of dielectric layer stacks, each of which may comprise a silicon nitride-silicon dioxide stack, the silicon dioxide portion of which may comprise a plasma silane-based oxide, an undoped silicate glass (USG), and/or a TEOS-based oxide, in any desired order. A wiring structure (not shown) for driving the various signals in each pixel 50 may be arranged within the insulating layer structure 30, preferably between or under a dielectric layer stack.

The color filter layer 40 is on the insulating layer structure 30. The color filter layer 40 includes a red color filter 42 transmitting red light, a green color filter 44 transmitting green light, and a blue color filter 46 transmitting blue light. In one embodiment, the red color filter 42, the green color filter 44, and the blue color filter 46 each are arranged in a position corresponding to an underlying photodiode PD of the pixel 50. Also, in the embodiment shown in FIG. 1, the height of the color filter layer 40 as measured from the upper surface of planarization layer 48 is the same.

The planarization layer 48 is arranged on the color filter 40. The planarization layer 48 performs a function of removing a step or providing a planar upper surface, when a step may exist between adjacent color filters (e.g., 42 and 44).

Microlenses 80 are on the planarization layer 48 corresponding to the pixels/photodiodes 20, over the insulating layer structure 30, the color filter layer 40, and the planarization layer 48. The microlenses 80 comprise a hydrophilic microlens 60 and a hydrophobic microlens 70. In the embodiment of FIG. 1, the microlenses 80 are arranged in positions corresponding to each color filter 42, 44, and/or 46.

Figure 3:
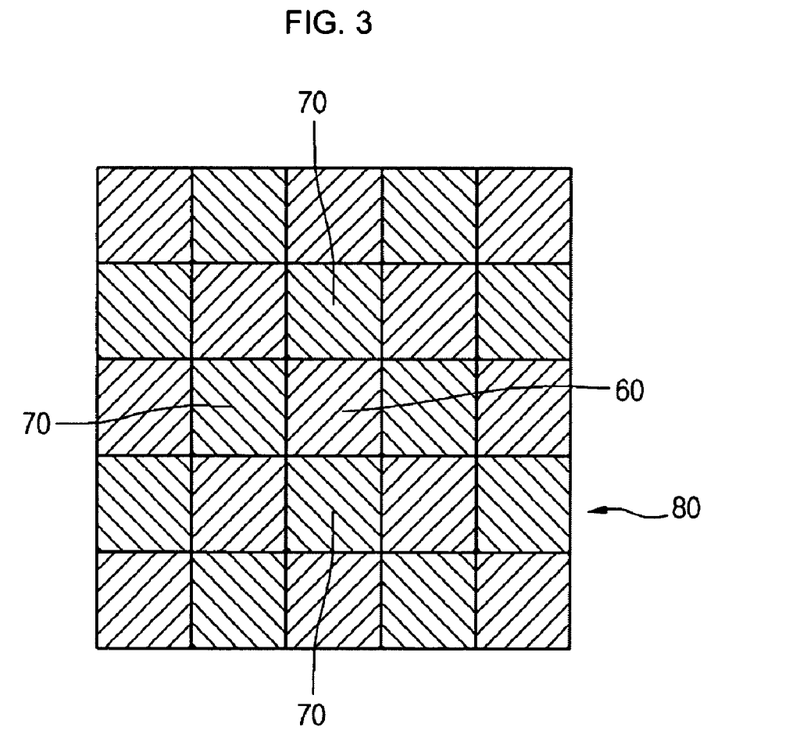
FIG. 3 is a plan view showing an exemplary arrangement of the microlenses as shown in FIG. 1.

FIG. 3 is a plan view showing the arrangement of the microlenses shown in FIG. 1.

Referring to FIG. 3, the hydrophilic microlens 60 and the hydrophobic microlens 70 are alternately arranged on the planarization layer 48. Also, the edges of the hydrophilic microlens 60 and the hydrophobic microlens 70 contact each other.

The embodiment of FIG. 3 shows that the hydrophilic microlenses 60 and the hydrophobic microlenses 70 are arranged in a matrix form, wherein about four hydrophobic microlenses 70 are arranged at the circumference of one hydrophilic microlens 60. Differently therefrom and/or complementary thereto, about four hydrophilic microlenses may be arranged at the circumference of one hydrophobic microlens 70. In general, a "hydrophilic" microlens refers to a microlens made substantially from a hydrophilic photoresist material, as is known in the art, and a "hydrophobic" microlens refers to a microlens made substantially from a hydrophobic photoresist material, as is known in the art.

FIGS. 4 to 9 are cross-sectional views showing an exemplary method for manufacturing an image sensor according to a first embodiment.

Figure 4:
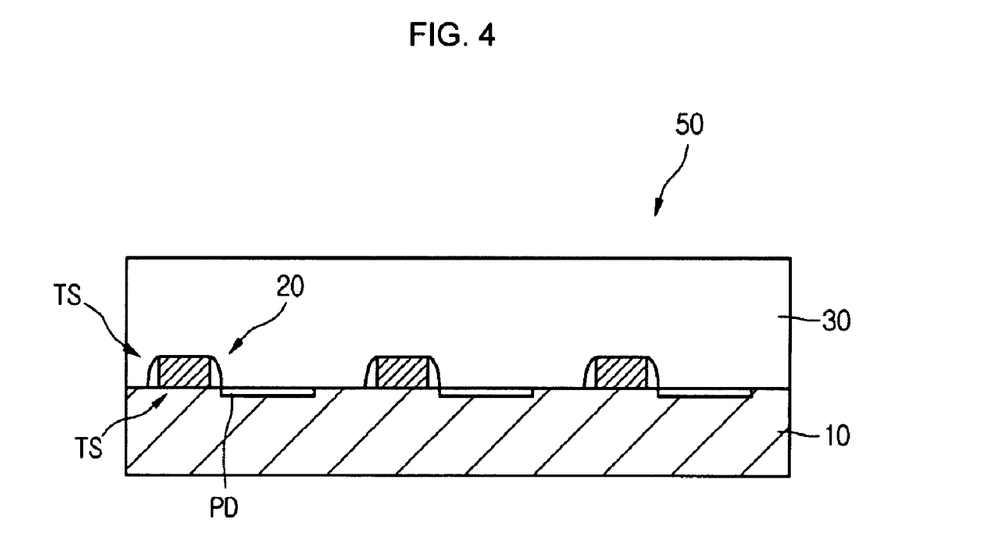
FIGS. 4 to 9 are cross-sectional views showing an exemplary method for manufacturing an image sensor according to the first embodiment.

FIG. 4 is a cross-sectional view showing pixel and photodiode structures for an exemplary image sensor according to an embodiment of the invention.

Referring to FIG. 4, a pixel structure 50 is formed on a semiconductor substrate 10. In order to form the pixel structure 50, unit pixels 20 including a transistor structure TS (which may include three to five transistors per pixel) and a photodiode PD are formed on the semiconductor substrate 10. Generally, the gates of the transistors TS are formed by growing a thin thermal oxide on the substrate 10, depositing a polysilicon layer on the thermal oxide, patterning the polysilicon layer and the thermal oxide to form the transistor gates, then implanting the source/drain terminals for the transistor structure TS and the photodiode PD (generally comprising a P-N junction (e.g., 16) at the interface between a P-type ion implantation region [which may be relatively shallow] and an N-type ion implantation region [which may be relatively deep]) using various masks, as is known in the art.

After the pixels 20 are formed on the semiconductor substrate 10, an insulating layer structure 30 is formed on the semiconductor substrate 10. The insulating layer structure 30 covers the pixels 20 to insulate it. While forming the insulating layer structure 30, a wiring structure (not shown) for driving signals in the pixel 20 can be formed inside the insulating layer structure 30 (see the discussion elsewhere herein).

Figure 5:
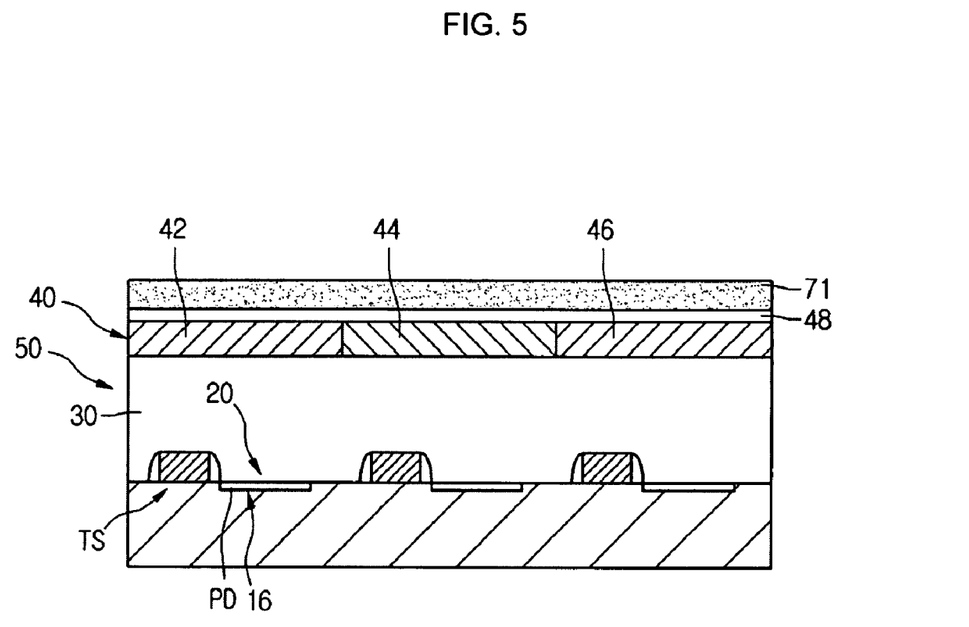

FIG. 5 is a cross-sectional view showing the color filter layer and the planarization layer formed on the exemplary structure shown in FIG. 4.

Referring to FIG. 5, after the insulating layer 30 is formed, a color filter layer 40 is formed on the insulating layer 30. The color filter layer 40 is formed by patterning a photoresist layer including one or more pigments and/or dyes in one or more photosensitive materials. The color filter layer 40 may comprise a red color filter 42, a green color filter 44, and a blue color filter 46. The red color filter 42, the green color filter 44, and the blue color filter 46 are formed in a position corresponding to each pixel 20. Alternatively, the color filter layer 40 may comprise a yellow color filter, a cyan color filter, and a magenta color filter.

After the color filter layer 40 is formed, the planarization layer 48 is formed on the color filter 40. The planarization layer 48 provides a planar upper surface on which to form microlenses, thereby functioning to remove any step that may exist between adjacent color filters.

Figure 6:
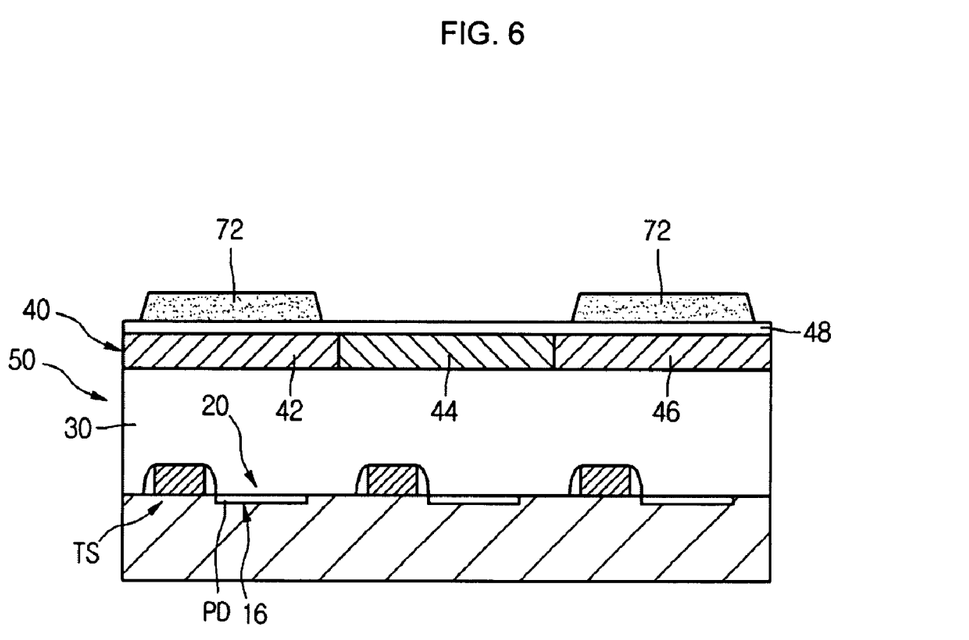
Figure 7:
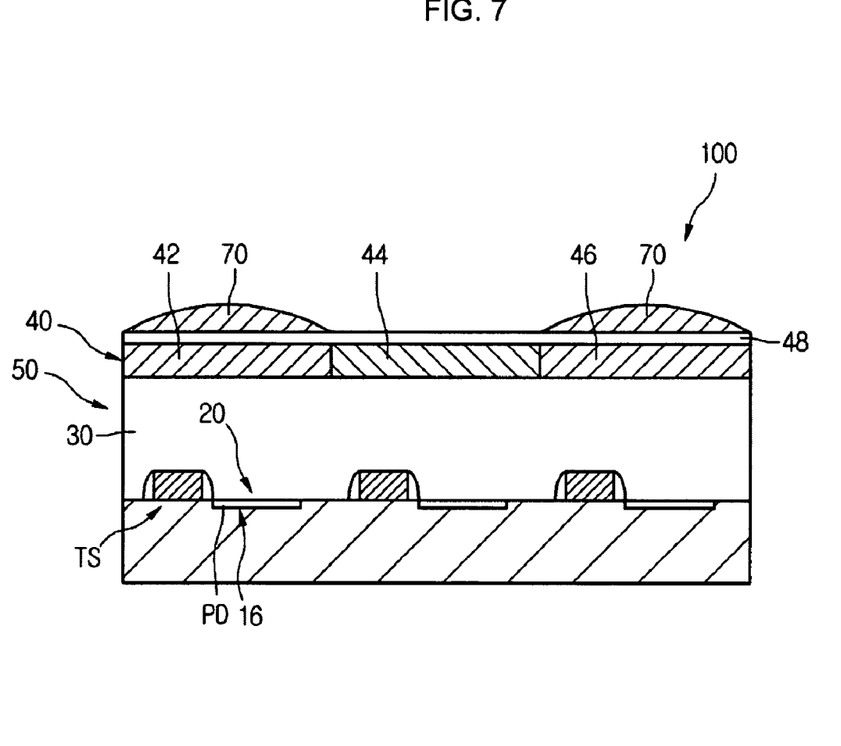

FIGS. 5 to 7 are cross-sectional views showing a hydrophobic microlens may be formed first in the first embodiment.

Referring again to FIG. 5, a hydrophobic photosensitive layer 71 is formed on the planarization layer 48. In one embodiment, the hydrophobic photosensitive layer 71 includes hydrophobic materials (e.g., a hydrophobic photoresist) having hydrophobic characteristics.

Referring to FIG. 6, after the hydrophobic photosensitive layer 71 is formed, the hydrophobic photosensitive layer 71 is patterned by a photolithography process including an exposure process and a development process so that hydrophobic microlens precursors 72 are formed on the planarization layer 48 corresponding to the red color filter 42 and the blue color filter 46.

Referring to FIG. 7, after the hydrophobic microlens precursors 72 are formed on the planarization layer 48, the hydrophobic microlens precursors 72 are reflowed by heating so that hydrophobic microlenses 70 are formed on the planarization layer 78.

Figure 8:
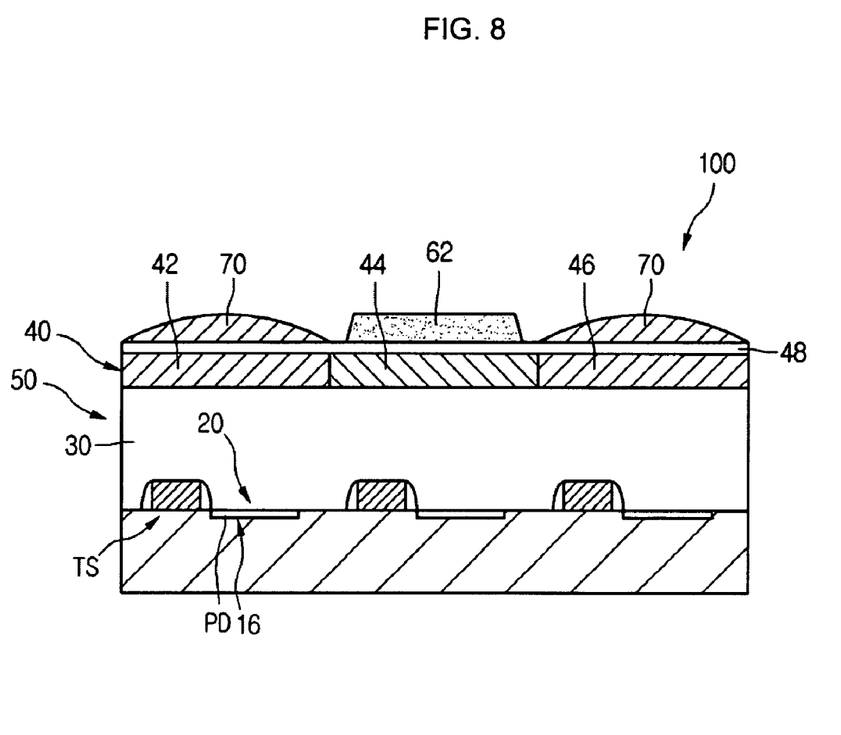
Figure 9:
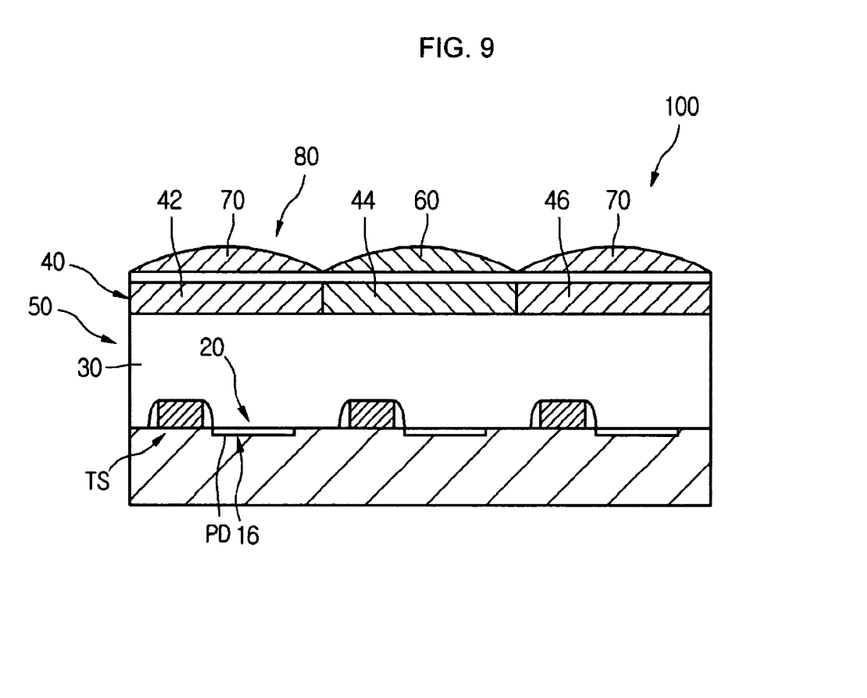

FIGS. 8 and 9 are cross-sectional views showing that a hydrophilic microlens may be formed second in the exemplary embodiment.

Referring to FIG. 8, in order to form a hydrophilic microlens, a hydrophilic photosensitive layer (e.g., a hydrophilic photoresist, not shown) is again applied to the planarization layer 48 (e.g., by spin-coating or other deposition process). In the exemplary embodiment, the hydrophilic photosensitive layer (not shown) includes one or more hydrophilic materials having hydrophilic characteristics.

After the hydrophilic photosensitive layer is deposited on the planarization layer 48, the hydrophilic photosensitive layer is patterned by a photolithography process including an exposure process and a development process so that a hydrophilic microlens precursor 62 is formed on the planarization layer 48 corresponding to the color filter 44. In one embodiment, color filter 44 is a green color filter.

Referring to FIG. 9, after the hydrophilic microlens precursor 62 is formed on the planarization layer 48, the hydrophilic microlens precursor 62 is reflowed by heating so that a hydrophilic microlens 60 is formed on the planarization layer 48. Alternatively, the hydrophilic microlens precursor 62 may be formed on the structure of FIG. 6, and both the hydrophobic microlens precursors 72 and the hydrophilic microlens precursor 62 may be reflowed (or heated) at the same time to form microlenses 60 and 70.

This first embodiment describes first forming hydrophobic microlenses 70 on the planarization layer 48, and then forming the hydrophilic microlenses 60. Differently therefrom, it may be of course allowed that the hydrophilic microlenses 70 are first formed on the planarization layer 48, and then the hydrophilic microlenses 60 are formed. In either case, because of the hydrophilic/hydrophobic nature of the different photoresists, the first-formed microlenses are largely unaffected by the processing of the later-formed microlenses.

Also, the second microlenses 60 are formed so that the gap between the edge of the second microlens 60 and the edge of the first microlens 70 is completely removed, making it possible to improve the image quality.

Second Embodiment

Figure 10:
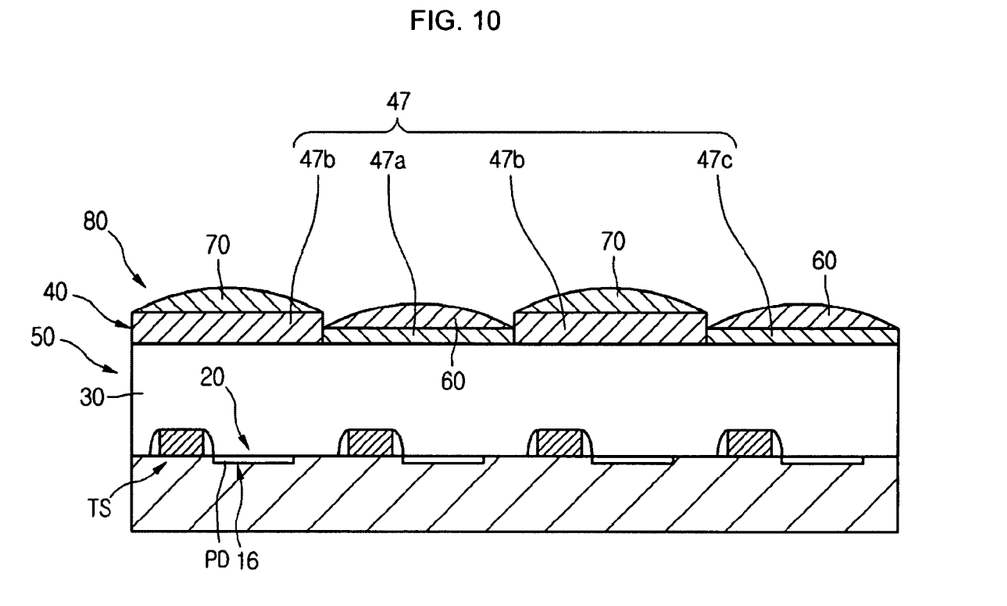
FIG. 10 is a cross-sectional view of an exemplary image sensor according to a second embodiment.

FIG. 10 is a cross-sectional view of an image sensor according to a second embodiment.

Referring to FIG. 10, an exemplary structure 50 is arranged on a semiconductor substrate 10. In the embodiment, the structure 50 comprises a pixel 20, an insulating layer structure 30, and a color filter 47. The pixels 20 are formed in a plurality on the semiconductor substrate 10. FIG. 10, shows, for example, four unit pixels 20.

The insulating layer 30 covers the pixels 20 on the semiconductor substrate 10. A wiring structure (not shown) for driving signals in the pixels 20 may be arranged within the insulating layer 30.

The color filter 47 is arranged on the insulating layer structure 30. The color filter layer 47 includes a red color filter 47a transmitting red light, a green color filter 47b transmitting green light, and a blue color filter 47c transmitting blue light. Alternatively, the color filter layer 47 may comprise a yellow color filter, a cyan color filter, and a magenta color filter. In the exemplary embodiment, the red color filter 47a, the green color filter 47b, and the blue color filter 47c each are arranged in positions corresponding to the photodiodes PD or the pixels 20.

Also, in one exemplary embodiment, the thicknesses of different color filters (e.g., 47a and 47b) as measured from the upper surface of the insulating layer 30 may be different. For example, the thickness of the red color filter 47a measured from the upper surface of the insulating layer structure 30 may be about 8,000 Å to about 8,100 Å, the thickness of the blue color filter 47c measured from the upper surface of the insulating layer 30 may be about 7,900 Å to about 8,000 Å, and the thickness of the green color filter 47b measured from the upper surface of the insulating layer 30 may be about 10,000 Å to 11,000 Å. In other words, in an exemplary embodiment, the color filters 47a-c may have different thickness, wherein the thickness of one color filter 47b (e.g., a green color filter) is much thicker than that of other color filters 47a and/or 47c (e.g., the red and/or blue color filters).

In the embodiment of FIGS. 10-15, the arrangement of the color filters 47 having different thicknesses is very important in reducing the gap between the microlenses. For example, the relatively thick green color filter 47b may be arranged or formed at the circumference of one or more relatively thin red color filters 47a and/or one or more relatively thin blue color filters 47c. Alternatively, the relatively thin color filters 47a and/or 47c may be formed after the relatively thick color filter 47b. Therefore, a recess may be formed on the upper surface of the red color filters 47a and/or the blue color filters 47c by the green color filters 47b. As a result, the microlenses 60 on the relatively thin color filters 47a and 47c can extend up to the side wall of the color filters 47b, which provides some additional margin for patterning the precursors for microlenses 60, as the microlenses 60 might otherwise reflow beyond the edges of the color filters 47a and 47c if not for the sidewalls of the color filters 47b.

Furthermore, the edges of the color filters 47b and the surface tension of the material of the microlenses 70 during the reflow process can act as a "flow stop" and constrain the circumference of microlenses 70 at the edges of the color filters 47b, thereby preventing the microlenses 70 from extending beyond the edges of the color filters 47b, and providing additional margin for patterning the precursors for microlenses 70. The margin(s) for forming adjacent microlenses with a zero gap between them can be further increased by increasing the height difference between adjacent color filters and/or improving the height margin(s) when forming the color filters.

In the exemplary embodiment, microlenses 80 are arranged on the upper surface of the color filter layer 47. The microlenses 80 comprise hydrophilic microlenses 60 and hydrophobic microlenses 70 as described herein. In the exemplary embodiment, the microlenses 80 are arranged in a position corresponding to each color filter 47a, 47b or 47c.

More specifically, for example, hydrophilic microlenses 60 are formed on the relatively thin red and blue color filters 47a and 47c, and hydrophobic microlenses 70 are formed on the relatively thick green color filter 47b at the circumference of the red color filter 47a and the blue color filter 47c. Differently therefrom, it may be of course allowed that the hydrophobic microlenses may be formed on the relatively thin red color filter 47a and the blue color filter 47c, and the hydrophilic microlenses may be formed on the relatively thick green color filter 47b.

In one exemplary embodiment, the thickness of the hydrophilic microlens 60 on the red color filter 47a and the blue color filter 47c and that of the hydrophobic microlens 70 on the green color filter 47b may be the same or different. For example, the when the microlenses have a different thickness, the thickness of the hydrophilic microlens 60 may be about 3400 Å and that of the hydrophobic microlens 70 may be about 3200 Å.

However, since the thickness of the green color filter 47b may be thicker than that of the red color filter 47a and the blue color filter 47c, when the thickness of the hydrophilic microlens 60 and that of the hydrophobic microlens 70 are the same, the light condensed in the hydrophilic microlens 60 and the hydrophobic microlens 70 may not be exactly focused on the photodiode PD of the pixel 20. In consideration of this, preferably, in another embodiment, the hydrophilic microlens 60 has a first refractive index (e.g., about 1.56) and the hydrophobic microlens 70 has a second refractive index (e.g., about 1.52) so that the light focused on the hydrophilic microlens 60 and the hydrophobic microlens 70 can be focused on the photodiode PD of the pixel 20. In this latter exemplary embodiment, the first refractive index and the second refractive index can be controlled, depending on the materials of the hydrophilic microlens 60 and the hydrophobic microlens 70. Differently therefrom, it may be of course allowed that the hydrophilic microlens 60 has the second refractive index and the hydrophobic microlens 70 has the first refractive index.

Figure 11:
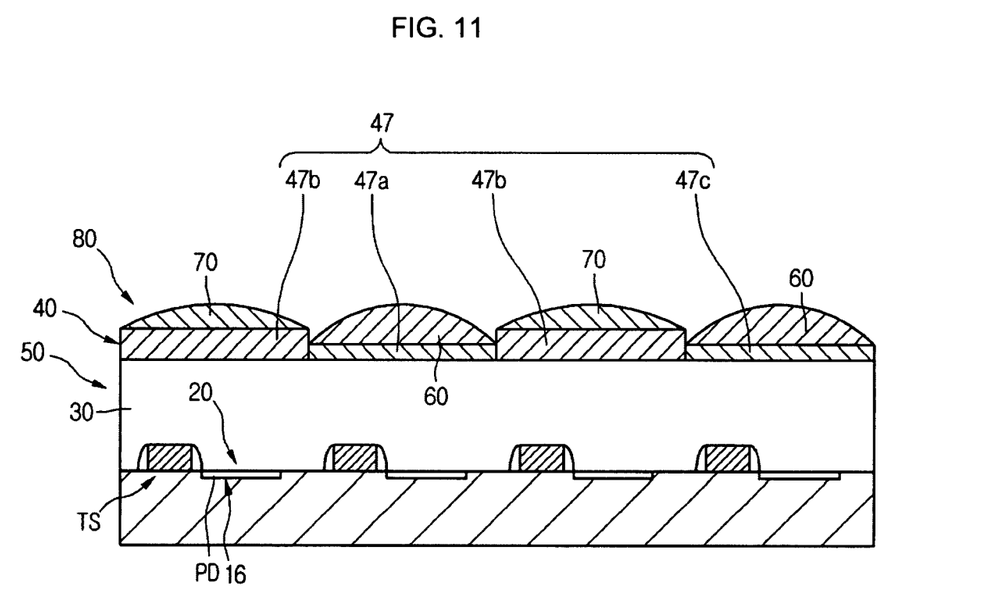
FIG. 11 is a cross-sectional view showing an alternative embodiment of the exemplary image sensor of FIG. 10.

FIG. 11 is a cross-sectional view showing another embodiment of the image sensor of FIG. 10.

Referring to FIG. 11, the hydrophobic microlenses 70 on the green color filter 47b may have a first thickness and the hydrophilic microlenses 60 on the red color filter 47a and the blue color filter 47c may have a second thickness greater than the first thickness so that the light passing through the hydrophilic microlenses 60 and the hydrophobic microlenses 70 can be focused on the photodiodes PD of the unit pixels 20.

FIGS. 12 to 15 are cross-sectional views showing a method for manufacturing an image sensor according to the second embodiment.

Figure 12:
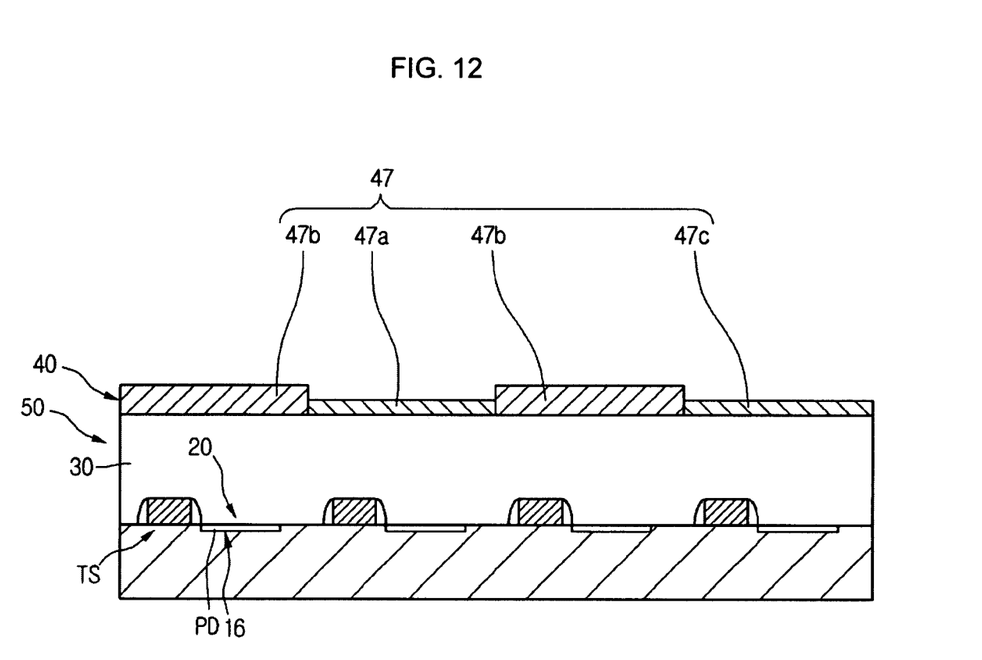
FIGS. 12 to 15 are cross-sectional views showing a method for manufacturing an exemplary image sensor according to the second embodiment.

FIG. 12 is a cross-sectional view showing a photodiode structure of an image sensor according to an exemplary embodiment.

Referring to FIG. 12, an image sensor structure 50 including a plurality of unit pixels 20 is formed on a semiconductor substrate 10. In order to form the structure 50, unit pixels 20 including a transistor structure TS (which may comprise three to five transistors) and a photodiode PD are formed on the semiconductor substrate 10.

After the pixels 20 are formed on the semiconductor substrate 10, an insulating layer 30 is formed on the semiconductor substrate 10. As for the other embodiments, the insulating layer 30 may be formed by any known technique for forming such insulating layers (e.g., chemical vapor deposition [CVD], which can be plasma-enhanced, plasma-assisted, high density plasma-assisted, etc.). The insulating layer 30 covers the pixels 20 to insulate them from overlying and/or proximate conductive structures. While forming the insulating layer 30, a wiring structure (not shown) for driving signals in the pixels 20 can be formed in and/or on the insulating layer 30.

After the structure 50 is formed, a color filter layer 47 is formed on the insulating layer 30. The color filters 47a-47c are formed in position corresponding to the photodiodes PD of each pixel 20.

The color filter layer 47 may comprise a red color filter 47a, a blue color filter 47c, and a green color filter 47b. In order to form the color filters 47a-47c, the red color filter 47a and the blue color filter 47c are formed in a matrix, skipping every other pixel area (e.g., not adjacent to each other). The red color filter 47a and the blue color filter 47c are thereby alternately arranged.

In one embodiment, although the thickness of the red color filter 47a and the blue color filter 47c may be different, for convenience of explanation, they are presumed to have the same or similar first thickness.

After the red color filters 47a and the blue color filters 47c are formed, the green color filters 47b having a second thickness greater than the first thickness are formed where the red color filter 47a and the blue color filter 47c are not formed so that a recess is formed on the upper surface of the red color filters 47a and the blue color filters 47c by the green color filters 47b. Of course, the green color filters 47b may be formed first, then the red and blue color filters 47a and 47c.

Figure 13:
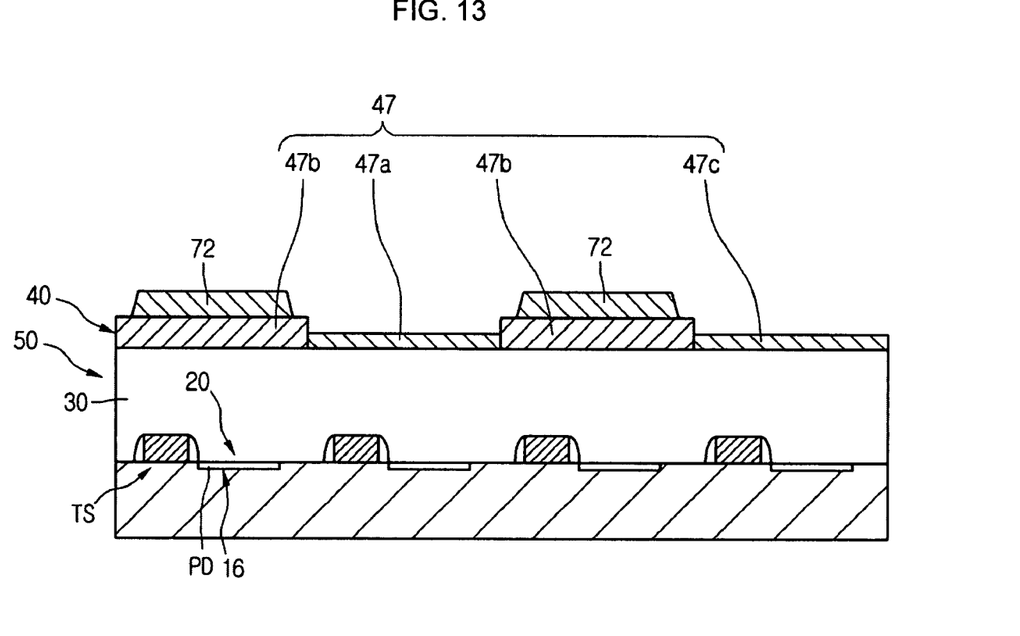

Referring to FIG. 13, a hydrophobic photosensitive layer (not shown) can be formed on the color filter 47. In one embodiment, the hydrophobic photosensitive layer includes hydrophobic materials having hydrophobic characteristics, as described elsewhere herein.

After the hydrophobic photosensitive layer is formed, the hydrophobic photosensitive layer is patterned by a photolithography process including an exposure process and a development process so that hydrophobic microlens precursors 72 are formed on the green color filter 47b.

Figure 14:
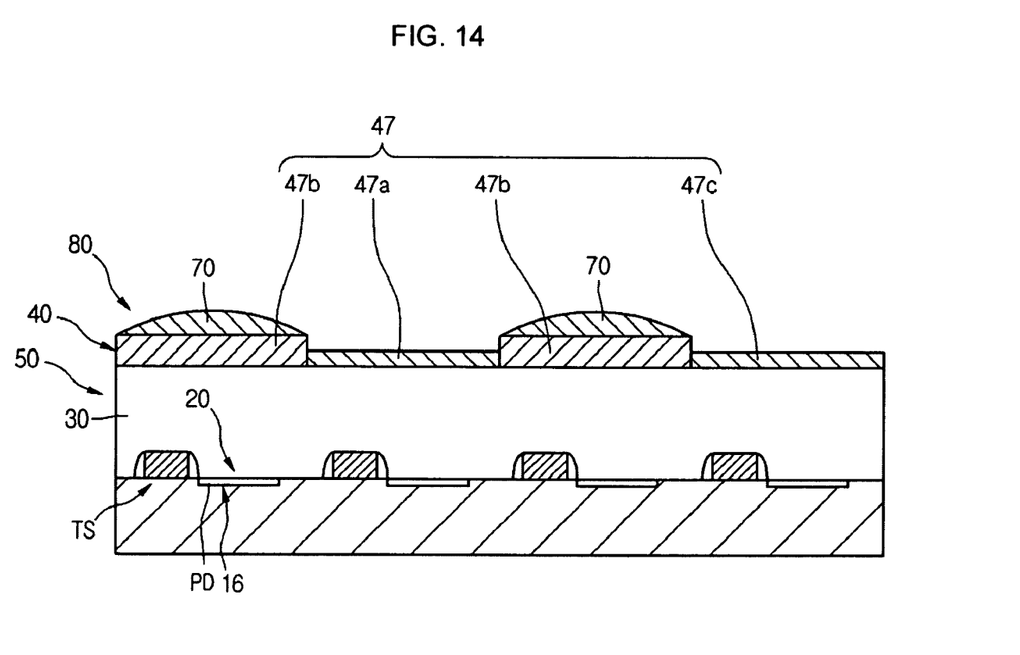

Referring to FIG. 14, after the hydrophobic microlens precursors 72 are formed on the green color filters 47b, the hydrophobic microlens precursors 72 are reflowed by heating so that hydrophobic microlenses 70 are formed on the green color filters 47b.

Figure 15:
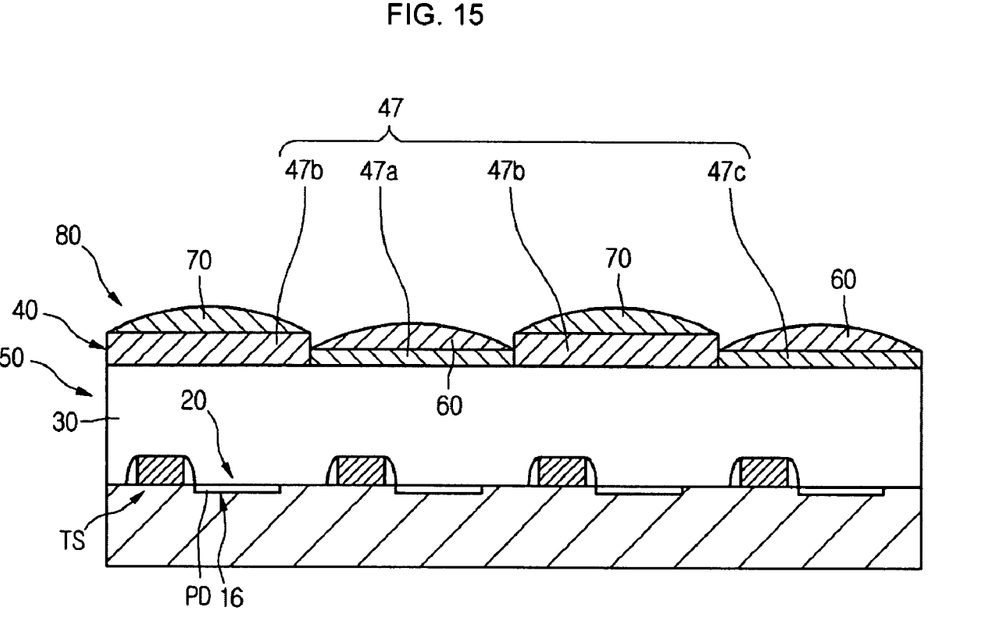

Referring to FIG. 15, in order to form hydrophilic microlenses, a hydrophilic photosensitive layer (not shown) is again deposited on the color filter layer 47. In one embodiment, the hydrophilic photosensitive layer (not shown) includes hydrophilic materials having hydrophilic characteristics, as described elsewhere herein.

After the hydrophilic photosensitive layer is formed, the hydrophilic photosensitive layer is patterned by a photolithography process including an exposure process and a development process so that hydrophilic microlens precursors are formed on the red color filter 47a and the blue color filter 47c, and hydrophilic microlens precursors are reflowed by heating to form a hydrophilic microlens 60 on the red color filter 47a and/or the blue color filter 47c, forming an image sensor.

As described above, the hydrophilic microlens and the hydrophobic microlens are alternately formed on the color filters to remove the gap between the hydrophilic microlens and the hydrophobic microlens, having an advantage capable of improving the image quality.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
    photodiodes on a semiconductor;
    color filters on or over the respective photodiodes;
    a planarization layer covering the color filters; and
    hydrophilic microlenses on the planarization layer corresponding to a first color filter, alternating with hydrophobic microlenses in contact with edges of the hydrophilic microlenses, corresponding to one or more second color filters.

2. The image sensor according to claim 1, wherein the hydrophobic microlenses comprise a hydrophobic photoresist material, and the hydrophilic microlenses comprise a hydrophilic photoresist material.

3. The image sensor according to claim 1, wherein the hydrophilic microlenses and the hydrophobic microlenses are in a matrix, wherein one hydrophilic microlens has a circumference in contact with four hydrophobic microlenses.

4. The image sensor according to claim 3, wherein a plurality of the hydrophobic microlenses each has a circumference in contact with four microlenses.

5. The image sensor according to claim 1, wherein the hydrophilic microlenses and the hydrophobic microlenses are in a matrix, wherein one hydrophobic microlens has a circumference in contact with four hydrophilic microlenses.

6. The image sensor according to claim 5, wherein a plurality of the hydrophilic microlenses each has a circumference in contact with four hydrophobic microlenses.

7. The image sensor according to claim 1, wherein the color filters include a red color filter transmitting red light, a green color filter transmitting green light, and a blue color filter transmitting blue light, wherein the red, green, and blue color filters have a same height.

8. A method for manufacturing an image sensor comprising the steps of:
    forming photodiode structures on a semiconductor substrate;
    forming a first color filter, a second filter adjacent to the first color filter, and a third color filter adjacent to the second color filter on or over respective photodiode structures;
    forming a planarization layer covering the first, second and third color filters;
    forming hydrophobic first microlenses on the planarization layer corresponding to the first and third color filters; and
    forming hydrophilic second microlenses on the planarization layer corresponding to the second color filter, the second microlenses contacting edges of the first microlenses.

9. The method according to claim 8, wherein the step of forming the first micro lenses comprises:
    forming a first photosensitive layer on the planarization layer;
    forming a first microlens precursor on the planarization layer corresponding to the first and third color filters by patterning the first photosensitive layer; and
    reflowing the first microlens precursor.

10. The method according to claim 8, wherein the step of forming second micro lenses comprises:
    forming a second photosensitive layer on the planarization layer;
    forming a second microlens precursor on the planarization layer corresponding to the second color filter by patterning the second photosensitive layer; and
    reflowing the second microlens precursor.

11. The method according to claim 5, wherein the first color filter is a red color filter, the third color filter is a blue color filter, and the second color filter is a green color filter.

12. The method according to claim 8, wherein the hydrophobic first microlenses are formed from a hydrophobic photoresist material, and the hydrophilic second microlenses are formed from a hydrophilic photoresist material.

13. The method according to claim 8, wherein the hydrophilic microlenses and the hydrophobic microlenses are in a matrix, wherein a plurality of the hydrophilic microlenses each has a circumference in contact with four hydrophobic microlenses, and a plurality of the hydrophobic microlenses each has a circumference in contact with four hydrophilic microlenses.

14. An image sensor comprising:
    photodiodes on a semiconductor substrate;
    a color filter layer on or over the photodiodes, having a first color filter with a first height and a second color filter with a second height different from the first height, the second color filter being at an edge of the first color filter; and
    microlenses including a first microlens on or over the first color filter and a second microlens on or over the second color filter, the first microlens comprising a hydrophilic material having a first refractive index and the second microlens comprising a hydrophobic material having a second refractive index.

15. The image sensor according to claim 14, wherein the first color filter is a red color filter or a blue color filter.

16. The image sensor according to claim 14, wherein the second color filter is a green color filter.

17. The image sensor according to claim 14, wherein the first microlenses comprise a hydrophobic photoresist material, and the second microlenses comprise a hydrophilic photoresist material.

18. The image sensor according to claim 14, wherein the hydrophilic microlenses and the hydrophobic microlenses are in a matrix, wherein a plurality of the hydrophilic microlenses each has a circumference in contact with four hydrophobic microlenses, and a plurality of the hydrophobic microlenses each has a circumference in contact with four hydrophilic microlenses.

19. A method for manufacturing an image sensor comprising the steps of:

forming photodiodes on a semiconductor substrate;

forming color filters formed on or over respective photodiodes, including a first color filter with a first thickness and one or more second color filters with a second thickness greater than the first thickness, at an edge of the first color filter;

forming a hydrophilic photoresist layer having a first light refractive index on the first color filter;

forming a first hydrophilic microlens precursor on the first color filter by patterning the hydrophilic photoresist layer;

curing the first hydrophilic microlens precursor to form a first microlens;

forming a hydrophobic photoresist layer having a second light refractive index on the second color filter(s);

forming a second hydrophobic microlens precursor on the second color filter(s) by patterning the hydrophobic photoresist layer; and curing the second hydrophobic microlens precursor to form a second microlens.

20. The method according to claim 19, wherein the hydrophilic microlenses and the hydrophobic microlenses are in a matrix, wherein a plurality of the hydrophilic microlenses each has a circumference in contact with four hydrophobic microlenses, and a plurality of the hydrophobic microlenses each has a circumference in contact with four hydrophilic microlenses.

* * * * *